United States Patent [19]

Steennis

[11] Patent Number: 5,767,684
[45] Date of Patent: Jun. 16, 1998

[54] METHOD AND APPARATUS FOR MEASURING PARTIAL DISCHARGES IN CABLES

[75] Inventor: Evert Frederik Steennis, Arnhem, Netherlands

[73] Assignee: N.V. Kema, Arnhem, Netherlands

[21] Appl. No.: 424,359

[22] PCT Filed: Nov. 5, 1993

[86] PCT No.: PCT/NL93/00232

§ 371 Date: Jun. 12, 1995

§ 102(e) Date: Jun. 12, 1995

[87] PCT Pub. No.: WO94/10579

PCT Pub. Date: May 11, 1994

[30] Foreign Application Priority Data

Nov. 5, 1992 [NL] Netherlands ............ 92.01944

[51] Int. Cl.$^6$ ........................... G01R 31/08
[52] U.S. Cl. ............ 324/536; 324/127; 324/523
[58] Field of Search .................. 324/536, 523, 324/126, 127, 117 R, 95; 342/124

[56] References Cited

U.S. PATENT DOCUMENTS

| | | | |
|---|---|---|---|
| 1,931,225 | 10/1933 | Heaton | 324/402 |
| 3,657,650 | 4/1972 | Arndt | 324/126 |
| 3,743,922 | 7/1973 | Festos | 324/402 |
| 4,446,420 | 5/1984 | Drouet | 324/536 |
| 4,804,917 | 2/1989 | Miller et al. | 324/95 |
| 5,416,418 | 5/1995 | Maureira et al. | 324/536 |

FOREIGN PATENT DOCUMENTS

| | | |
|---|---|---|
| 0390034 | 10/1990 | European Pat. Off. . |
| 0424598 | 5/1991 | European Pat. Off. . |
| 539904 | 9/1941 | United Kingdom . |

OTHER PUBLICATIONS

Patent Abstracts of Japan, vol. 16, No. 308, 7 Jul. 1992 (JP 4084779, 18 Mar. 1992).

Patent Abstracts of Japan, vol. 15, No. 418, 23 Oct. 1991 (Jp 4170077, 23 Jul. 1991).

IEEE Transactions on Power Delivery, vol. 5 No. 2, Apr. 1990; Mashikian et al., Location and Characterization of Partial Discharge Sites in Shielded Power Cables.

*Primary Examiner*—Ernest F. Karlsen
*Attorney, Agent, or Firm*—Banner & Witcoff, Ltd.

[57] ABSTRACT

The invention relates to a method for detecting partial discharges occurring in a cable, wherein the cable has an earth screen with a helical structure, comprising the following steps of: arranging at least one detection coil round the cable for detecting electromagnetic pulses travelling along the cable; applying a potential difference between the core and the earth shield of the cable; and analyzing pulses generated by possible partial discharges in the at least one detection coil in order to determine the location and quality of the partial discharge having caused the pulse, wherein the detection coil is adapted to process signals with a frequency higher than 100 MHz. It has been found that with coils comprising only such a limited number of turns the signal detected by the coil is a much better representation of the form of the electromagnetic pulse travelling along the cable.

4 Claims, 1 Drawing Sheet

METHOD AND APPARATUS FOR MEASURING PARTIAL DISCHARGES IN CABLES

The present invention relates to a method for measuring partial discharges in cables.

Partial discharges are discharges which occur in the dielectric material situated between the inner conductor and the earth shield of a high-voltage cable, wherein no complete breakdown occurs.

The occurrence of such partial discharges causes deterioration in the quality of a cable. Partial discharges are also often the initiator of complete discharges (breakdown).

Known from JP-4084779 and JP-317077 is a method for detecting partial discharges occurring in a cable, wherein the cable has an earth screen with a helical structure, comprising the following steps of: arranging at least one detection coil round the cable for detecting electromagnetic pulses travelling along the cable; applying a potential difference between the core and the earth shield of the cable; and analyzing pulses generated by possible partial discharges in the at least one detection coil in order to determine the location and quality of the partial discharge having caused the pulse.

This known method makes use of the fact that the electromagnetic pulse caused by a partial discharge travels to either side in the cable. In the case of a cable provided with a solid earth screen such pulses on the outside of the cable are not detectable in this manner without local destruction.

In cables provided with an earth shield consisting of separate conductors with a helical structure, travelling pulses cause currents in both axial and tangential direction in the conductors of the earth shield. It should be noted here that, also as a result of the high frequency of the above described phenomena, the thus induced currents continue to follow the original conductor and do not cross over to a following conductor.

These tangentially flowing currents cause an axial magnetic field that is detectable outside the cable.

With regard to the theoretical basis of the above stated phenomena, reference is made to the graduate thesis "Study of the detection of partial discharge systems over an XPLE cable" by E. J. Bresser, Eindhoven, January 1984, and the doctoral thesis "The development of high-voltage measuring techniques" by G. G. Wolzak, Eindhoven, December 1983.

This axially travelling magnetic field comprises components in a wide frequency range, namely to several GHz. It is herein noted that the high frequency components are damped within a short distance and that the low frequency components can travel greater distances.

The method and apparatus known from JP-4084779 and JP-317077 relate to delivery inspection of cables. The cable in which possible partial discharges occur moves in relation to the measuring coil. For test purposes a voltage is applied to the cable. Any partial discharges will occur repeatedly and always at the same location or locations. An a location where a partial discharge generally occurs repeatedly moves past the coil, the voltage detected in the coil will be at a maximum. Localization is thus performed by repeatedly measuring at different relative positions of the measuring coil relative to the cable.

This method cannot be used for in situ measurements and is less suitable for measurements in laboratory situations.

In this known method the detection coil otherwise provides a signal deformed such that it is a representation dispersed through time of the pulse travelling along the cable. This makes it difficult to study the physical phenomena occurring during partial discharges and makes localization of the partial discharge inaccurate. These deficiencies are caused by the comparatively low frequency at which the measurements are performed.

The object of the invention is to provide a method and an apparatus applicable in as many situations as possible, by providing a greater accuracy in the localization and a greater insensitivity to external noise sources and a more faithful representation of the original signal form.

This object is achieved in that the detection coil is adapted to process signals with a frequency higher than 100 MHz.

The fact that the apparatus is suitable for high frequencies makes possible a much greater resolution of the localization of the partial discharge. The apparatus is moreover less sensitive to noise in such a high frequency range.

In preference such a method makes use of a detection coil comprising a maximum of only three turns.

It has been found that with coils comprising only such a limited number of turns the signal detected by the coil is a much better representation of the form of the electromagnetic pulse travelling along the cable. This effect can be attributed to the fact that a coil comprising more turns has a greater self-induction, so that the slopes of the detected signal decrease considerably. The best result is found to be obtained with only one turn.

Use can optionally also be made of wide-band amplifiers.

According to a first embodiment the signal can be processed with high frequency equipment. This processing can be formed by converting of the high frequency measurement signal into digital form or by processing of the signal with electronic equipment such that it can be further processed by low frequency equipment.

According to another preferred embodiment of the detection coil applied in this method the detection coil is band-shaped. This step also results in a decrease in the self-induction of the detection coil.

According to a further preferred embodiment both ends of the turn are mutually connected by means of a capacitor. This step results in the coil differentiating twice so that rapid phenomena can be more easily distinguished from the lower frequency interference signals. The differentiating action results in a deformation of the wave form.

According to another embodiment a detection coil comprises two turns connected in parallel. This step likewise results in reduction of the self-induction.

The present invention will subsequently be elucidated with reference to the annexed figures, in which.

Figure 1:
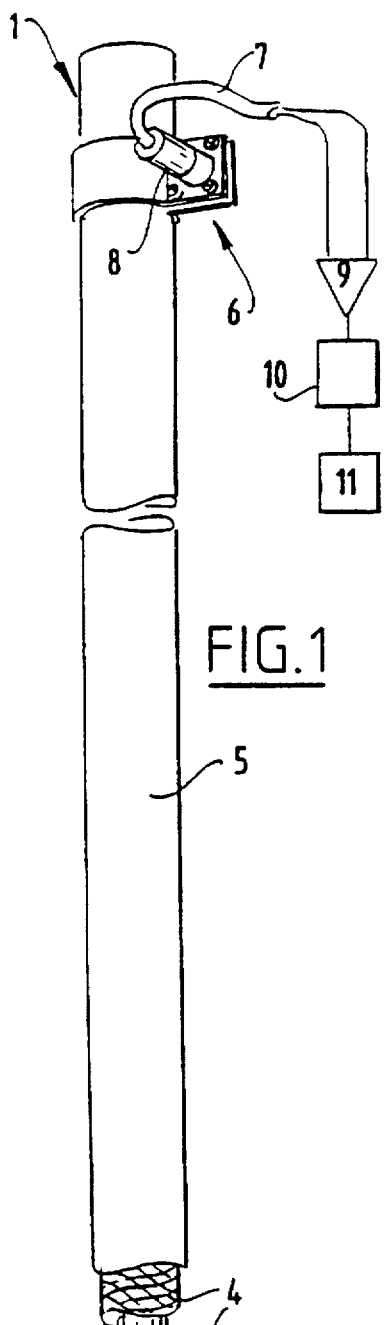
FIG. 1 shows a partly broken away, partly schematic view of a measuring arrangement for use in the method according to the present invention.

As already stated in the introduction, the method according to the invention is used for testing a high-voltage cable 1 or other components connected thereto, in particular cable accessories, but also transformers (etc). The high-voltage cable 1 is formed by an inner conductor 2, around which is arranged a dielectric 3, on the outside of which is located an earth shield 4. A sheath 5 is arranged round the screen 4. The inner and outer layer of the dielectric 3 are provided with a semiconducting layer used for voltage control. This is not shown in the drawing because it has no further relevance to the invention.

It should be noted here that the earth shield 4 has a helical structure, that is, that the earth shield is assembled from separate conductors which are arranged helically around the dielectric.

In performing the measurement according to the present invention a measuring coil 6 is arranged around the sheath 5 and connected by means of a measuring cable 7 and a connector 8 coupled thereto. The measuring cable leads, optionally after amplification, to a high-speed digitizer 10 and the signal is then stored with a computer 11. Also possible is an embodiment wherein the signal in the measuring cable 7, optionally after amplification, is carried to high-speed electronic equipment (discriminator and time amplitude converter), so that with relatively simple means the difference in delay of the pulse between two measuring coils is determined. For application in monitoring of NV accessories only level discrimination is necessary.

The cable is connected, as shown for instance in FIG. 1, to a high-voltage source 12. This source can have an adjustable amplitude (as in the laboratory) or a fixed amplitude (as in the mains electricity supply).

The position of the sensor can be chosen and altered freely in accordance with the result of a previous measurement.

In the laboratory the voltage between the inner conductor 2 and the earth shield 4 of the high-voltage cable is then increased by means of increasing the voltage generated by the generator 12. This process is continued until partial discharges occur above the detection threshold.

The measuring method can be supplemented in the laboratory with a separate detection device 13 which detects the occurrence of the discharges in order to switch off the high-voltage source 12 by means of relay 14. This is done to prevent complete breakdown taking place when the applied voltage is maintained or the voltage is further increased, which would destroy the cable.

Due to the fact that the coil 6 comprises only one or several turns, a signal is obtained on the coil 6 which, although having a small amplitude which is optionally corrected by the amplifier 9, has a form which, on account of the high time resolution, is a faithful representation of the electromagnetic pulse caused by the partial discharge and travelling along the high-voltage cable 1.

It is possible by means of the digitizer 10 to convert the signal generated by the electromagnetic pulse into digital form so that it can be stored easily in the (computer) memory 11 or be analyzed in digital form.

It should be noted here that the signals generated by the pulse have a very high frequency so that the digitizer 10 must have a very high sampling frequency; an order of magnitude of one GHz must be envisaged here. Because the coils are simple in structure it is quite possible to obtain identical signals from different measuring coils.

This advantage coupled with a high time resolution provides the possibility of localizing partial discharges very accurately to±1 cm.

A further advantage of the fact that the signals of two different coils are practically identical lies in the fact that it is thereby possible to determine in simple manner from which direction the partial discharge pulse comes. For this purpose the signals of the two coils are added, one signal of which, after a delay (by means of a delay line), is equal to the delay between the two coils. Coming from one side the signals neutralize each other, coming from the other side they arrive one after another and are detected. The total signal has hereby become direction-dependent.

An additional feature of a one turn coil is that it is easy to mount round a cable.

It is thus possible to study occurring partial discharges with the method described up to this point. The present invention can herewith be used for localizing partial discharges.

It is possible in the first instance to make an estimate of the location of the partial discharge by means of a measurement wherein a single coil is used; use is then made of the reflections occurring at the ends of the cable of the pulses generated by the partial discharge, wherein the location can be estimated from the difference in delay. It is equally possible to perform a measurement with two coils and thus determine the location.

The coil can then be arranged at the place where— according to calculation from an earlier measurement—the discharge has taken place; it can then be deduced from the polarity of the signal on which side of the coil the discharge has taken place.

Several embodiments of coils for use with the invention will now be discussed; depending on the application, specific embodiments of the measuring coil increase the usefulness of the measuring technique.

Figure 2:
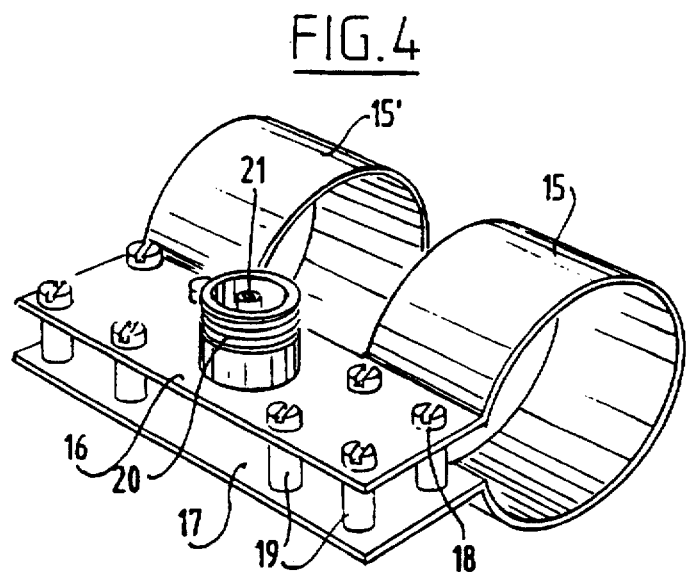
FIG. 2 is a perspective view of a first embodiment of a detection coil for use in the method according to the present invention.

In FIG. 2 is shown a first embodiment of a coil; this is formed by a band 15 made of metal, for instance brass, which is bent substantially to a ring shape and two ends of which are formed to flat plates 16, 17 extending mutually parallel. The band shape also results in a reduction of the self-induction. The plates 16, 17 are of course mutually connected by screws 18 manufactured from insulating material and nuts (not shown in the drawing) screwed thereon, wherein both plates 16, 17 are held at a mutual distance by insulating sleeves 19.

Arranged on the upper plate 16 is a connector 20 connected to the plate 16. The central conductor 21 is connected to the lower plate 17.

Figure 3:
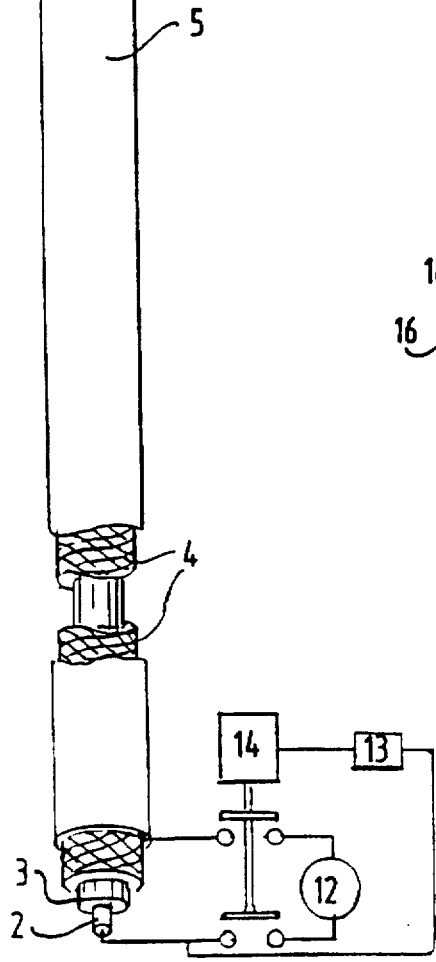
FIG. 3 shows a second embodiment of the detection coil depicted in FIG. 2.

The coil shown in FIG. 3 differs from the coil shown in FIG. 2 in the fact that a capacitor is arranged on the lower plate 17.

Arranged on the lower plate 17 in this embodiment is dielectric 22 on which is fixed an intermediate plate 23. The intermediate plate 23 of conducting material is held at a distance from plate 16 by means of insulating sleeves 24 and forms together with the lower plate 17 a capacitor.

In this situation the central conductor 21 of the connector is connected to plate 23. As already described above, this coil finds application in measurements wherein low frequency interference (and also 50 Hz signal) must be suppressed (12 dB/oct instead of 6 dB/oct) and the form of the signals is less relevant.

Figure 4:
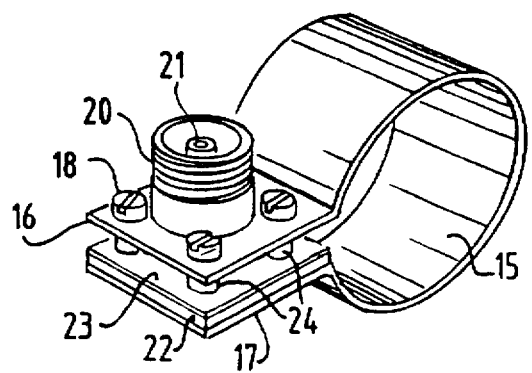
FIG. 4 shows a third embodiment of the detection coil depicted in FIG. 2.

Finally, the embodiment depicted in FIG. 4 shows a coil which is provided with two turns connected in parallel. The components of this coil correspond further with the coil as shown in FIG. 2.

It will be apparent that the above described embodiments of the coil only serve as examples; it is possible to apply other coils, for instance with standing edge (U-profile), so that the self-induction is further reduced, without departing from the invention.

I claim:

1. Method for detecting partial discharges occurring in a cable, wherein the cable has a core and an earth shield with a helical structure, comprising the following steps of:

arranging at least one detection coil around the cable so as not to locally destruct the cable and for detecting electromagnetic pulses traveling along the cable;

applying a potential difference between the core and the earth shield of the cable; and analyzing pulses generated by possible partial discharges in at least one detection coil in order to determine the location and quality of the partial discharges having caused the pulses, wherein the detection coil is adapted to process signals with a frequency higher than 100 MHZ, characterized in that the detection coil comprises a one turn, and that the detection coil is made of strip-shaped of rectangular cross section metal.

2. Method as claimed in claim 1, characterized in that two detection coils placed at a mutual distance are used and that the location of the partial discharge is derived from the delay between the pulses detected on both detection coils.

3. Method as claimed in claim 1, characterized in that after detection of a first partial discharge at least one detection coil is displaced to the location where, according to calculation, the discharge takes place, and the measurement is subsequently repeated and the location derived from the polarity of the signal.

4. Method as claimed in claim 1, characterized in that the signal coming from the detection coils is recorded with a digitizer and thereafter analyzed, or is analyzed by means of high-speed electronic equipment (TAC-discriminator) as to amplitude and delay.

* * * * *